(12) United States Patent
Chehade et al.

(10) Patent No.: US 12,309,965 B2
(45) Date of Patent: May 20, 2025

(54) LIQUID COOLING DEVICE MOUNTED ON A HEAT GENERATING ELECTRONIC COMPONENT

(71) Applicant: OVH, Roubaix (FR)

(72) Inventors: Ali Chehade, Moncheaux (FR); Mohamad Hnayno, Roubaix (FR); Henryk Klaba, Roubaix (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 17/698,480

(22) Filed: Mar. 18, 2022

(65) Prior Publication Data
US 2022/0322573 A1    Oct. 6, 2022

(30) Foreign Application Priority Data

Apr. 1, 2021 (EP) ..................................... 21305427
Aug. 30, 2021 (EP) ..................................... 21306175

(51) Int. Cl.
*H05K 7/20* (2006.01)
*H01L 23/44* (2006.01)
(Continued)

(52) U.S. Cl.
CPC ......... *H05K 7/20236* (2013.01); *H01L 23/44* (2013.01); *H01L 23/473* (2013.01);
(Continued)

(58) Field of Classification Search
CPC ........... H05K 7/20236; H05K 7/20254; H05K 7/20772; H01L 23/44; H01L 23/473
See application file for complete search history.

(56) References Cited

U.S. PATENT DOCUMENTS

| 2,115,501 A | 4/1938 | Sergius |
| 2,316,296 A | 4/1943 | Simonds |

(Continued)

FOREIGN PATENT DOCUMENTS

| CN | 201898432 U | 7/2011 |
| CN | 103687443 A | 3/2014 |

(Continued)

OTHER PUBLICATIONS

Notice of Allowance with regard to the counterpart U.S. Appl. No. 17/691,494 mailed Apr. 17, 2023.

(Continued)

*Primary Examiner* — Zachary Pape
(74) *Attorney, Agent, or Firm* — BCF LLP

(57) ABSTRACT

A cooling device mountable on an electronic component comprising: a body having an internal fluid conduit for allowing a heat-transfer fluid to flow therethrough. The body comprises a first surface configured for mounting on the electronic component and permitting thermal transfer therethrough; a second surface; at least one side wall extending between the first surface and the second surface; and a gasket extending along the at least one side wall or a perimeter of the first surface, the gasket configured to extend away from the body beyond the first surface in a direction transverse thereto, to fluidly insulate the first surface when the first surface is mounted on the electronic component and submerged in the immersion cooling liquid in use.

19 Claims, 17 Drawing Sheets

(51) Int. Cl.
*H01L 23/473* (2006.01)
*F28D 21/00* (2006.01)
*G06F 1/20* (2006.01)
*H05K 1/02* (2006.01)

(52) U.S. Cl.
CPC ..... *H05K 7/20254* (2013.01); *H05K 7/20272* (2013.01); *F28D 2021/0029* (2013.01); *G06F 1/20* (2013.01); *H05K 1/0203* (2013.01); *H05K 7/20263* (2013.01)

(56) References Cited

U.S. PATENT DOCUMENTS

| | | | |
|---|---|---|---|
| 3,938,689 A | 2/1976 | De Munnik | |
| 4,279,966 A | 7/1981 | Wakana et al. | |
| 4,619,316 A | 10/1986 | Nakayama et al. | |
| 4,888,664 A * | 12/1989 | Roje | H05K 7/1412 361/825 |
| 5,268,814 A * | 12/1993 | Yakubowski | H01L 23/473 174/547 |
| 5,307,956 A | 5/1994 | Richter et al. | |
| 5,669,524 A | 9/1997 | Loedel | |
| 5,907,473 A | 5/1999 | Przilas et al. | |
| 6,023,934 A | 2/2000 | Gold | |
| 6,746,388 B2 | 6/2004 | Edwards et al. | |
| 6,847,525 B1 | 1/2005 | Smith et al. | |
| 6,883,593 B2 | 4/2005 | Johnson et al. | |
| 6,899,164 B1 | 5/2005 | Li et al. | |
| 7,369,410 B2 | 5/2008 | Chen et al. | |
| 7,403,392 B2 | 7/2008 | Attlesey et al. | |
| 7,414,845 B2 | 8/2008 | Attlesey et al. | |
| 7,527,085 B2 | 5/2009 | Iijima et al. | |
| 7,724,517 B2 | 5/2010 | Attlesey et al. | |
| 7,885,070 B2 | 2/2011 | Campbell et al. | |
| 7,900,796 B2 | 3/2011 | Ungrady et al. | |
| 7,905,106 B2 | 3/2011 | Attlesey | |
| 7,911,782 B2 | 3/2011 | Attlesey et al. | |
| 7,911,793 B2 | 3/2011 | Attlesey | |
| 8,009,419 B2 | 8/2011 | Attlesey et al. | |
| 8,014,150 B2 | 9/2011 | Campbell et al. | |
| 8,089,764 B2 | 1/2012 | Attlesey | |
| 8,089,765 B2 | 1/2012 | Attlesey | |
| 8,089,766 B2 | 1/2012 | Attlesey | |
| 8,291,964 B2 | 10/2012 | Hwang et al. | |
| 8,305,759 B2 | 11/2012 | Attlesey et al. | |
| 8,467,189 B2 | 6/2013 | Attlesey | |
| 8,619,425 B2 | 12/2013 | Campbell et al. | |
| 8,654,529 B2 | 2/2014 | Tufty et al. | |
| 8,934,244 B2 | 1/2015 | Shelnutt et al. | |
| 8,953,317 B2 | 2/2015 | Campbell et al. | |
| 9,049,800 B2 | 6/2015 | Shelnutt et al. | |
| 9,051,502 B2 | 6/2015 | Sedarous et al. | |
| 9,086,859 B2 | 7/2015 | Tufty et al. | |
| 9,128,681 B2 | 9/2015 | Tufty et al. | |
| 9,144,179 B2 | 9/2015 | Shelnutt et al. | |
| 9,155,230 B2 | 10/2015 | Eriksen | |
| 9,176,547 B2 | 11/2015 | Tufty et al. | |
| 9,195,282 B2 | 11/2015 | Shelnutt et al. | |
| 9,223,360 B2 | 12/2015 | Tufty et al. | |
| 9,328,964 B2 | 5/2016 | Shelnutt et al. | |
| 9,335,802 B2 | 5/2016 | Shelnutt et al. | |
| 9,351,429 B2 | 5/2016 | Shelnutt et al. | |
| 9,382,914 B1 | 7/2016 | Sharfi | |
| 9,426,927 B2 | 8/2016 | Shafer et al. | |
| 9,436,235 B2 | 9/2016 | Damaraju et al. | |
| 9,464,854 B2 | 10/2016 | Shelnutt et al. | |
| 9,529,395 B2 | 12/2016 | Franz et al. | |
| 9,699,938 B2 | 7/2017 | Shelnutt et al. | |
| 9,699,939 B2 | 7/2017 | Smith | |
| 9,717,166 B2 | 7/2017 | Eriksen | |
| 9,756,766 B2 | 9/2017 | Best | |
| 9,773,526 B2 | 9/2017 | Shelnutt et al. | |
| 9,781,859 B1 | 10/2017 | Wishman et al. | |
| 9,795,065 B2 | 10/2017 | Shelnutt et al. | |
| 9,839,164 B2 | 12/2017 | Shelnutt et al. | |
| 9,844,166 B2 | 12/2017 | Shelnutt et al. | |
| 9,921,622 B2 | 3/2018 | Shelnutt et al. | |
| 9,968,010 B2 | 5/2018 | Shelnutt et al. | |
| 9,992,914 B2 | 6/2018 | Best et al. | |
| 10,010,013 B2 | 6/2018 | Shelnutt et al. | |
| 10,018,425 B2 | 7/2018 | Shelnutt et al. | |
| 10,020,242 B2 | 7/2018 | Katsumata et al. | |
| 10,064,314 B2 | 8/2018 | Shelnutt et al. | |
| 10,104,808 B2 | 10/2018 | Scharinger et al. | |
| 10,130,008 B2 | 11/2018 | Shepard et al. | |
| 10,143,113 B2 | 11/2018 | Shelnutt et al. | |
| 10,143,114 B2 | 11/2018 | Shelnutt et al. | |
| 10,146,231 B2 | 12/2018 | Shelnutt et al. | |
| 10,149,408 B2 | 12/2018 | Fujiwara et al. | |
| 10,156,873 B2 | 12/2018 | Shelnutt et al. | |
| 10,172,262 B2 | 1/2019 | Shelnutt et al. | |
| 10,206,312 B2 | 2/2019 | Shelnutt et al. | |
| 10,212,857 B2 | 2/2019 | Eriksen | |
| 10,225,958 B1 | 3/2019 | Gao | |
| 10,238,010 B2 | 3/2019 | Shelnutt et al. | |
| 10,271,456 B2 | 4/2019 | Tufty et al. | |
| 10,321,609 B2 | 6/2019 | Hirai et al. | |
| 10,331,144 B2 | 6/2019 | Shelnutt et al. | |
| 10,399,190 B2 | 9/2019 | North et al. | |
| 10,542,635 B2 | 1/2020 | Nishiyama | |
| 10,598,441 B2 | 1/2020 | Kawabata et al. | |
| 10,617,042 B2 | 4/2020 | Shelnutt et al. | |
| 10,622,283 B2 | 4/2020 | Leobandung | |
| 10,624,236 B2 | 4/2020 | Inano et al. | |
| 10,624,242 B2 | 4/2020 | Best | |
| 10,638,641 B2 | 4/2020 | Franz et al. | |
| 10,645,841 B1 | 5/2020 | Mao et al. | |
| 10,653,036 B1 | 5/2020 | Gao | |
| 10,667,434 B1 | 5/2020 | Mao et al. | |
| 10,674,641 B2 | 6/2020 | Shepard et al. | |
| 10,716,238 B2 | 7/2020 | Brink | |
| 10,729,039 B2 | 7/2020 | Shelnutt et al. | |
| 10,791,647 B1 | 9/2020 | Miyamura et al. | |
| 10,809,011 B2 | 10/2020 | Chu et al. | |
| 10,871,807 B2 | 12/2020 | Best et al. | |
| 10,888,032 B2 | 1/2021 | Wakino et al. | |
| 10,917,998 B2 | 2/2021 | Shelnutt et al. | |
| 10,932,390 B2 | 2/2021 | Korikawa | |
| 10,939,580 B2 | 3/2021 | Gao | |
| 10,939,581 B1 | 3/2021 | Chen et al. | |
| 10,990,144 B2 | 4/2021 | Wang et al. | |
| 11,006,547 B2 | 5/2021 | Gao | |
| 11,032,939 B2 | 6/2021 | Tufty et al. | |
| 11,071,238 B2 | 7/2021 | Edmunds et al. | |
| 11,107,749 B2 | 8/2021 | Taniguchi et al. | |
| 11,268,739 B2 | 3/2022 | Wang et al. | |
| 11,572,614 B2 | 2/2023 | Sakamoto et al. | |
| 11,751,359 B2 | 9/2023 | Heydari | |
| 11,822,398 B2 | 11/2023 | Heydari | |
| 2002/0159233 A1 * | 10/2002 | Patel | H05K 7/20727 361/702 |
| 2004/0244947 A1 | 12/2004 | Chen | |
| 2005/0150637 A1 | 7/2005 | Tan et al. | |
| 2005/0248922 A1 | 11/2005 | Chu et al. | |
| 2007/0227756 A1 | 10/2007 | Doerr et al. | |
| 2009/0146294 A1 * | 6/2009 | Hillman | H01L 23/42 257/714 |
| 2009/0205590 A1 | 8/2009 | Vetrovec | |
| 2009/0260777 A1 | 10/2009 | Attlesey | |
| 2010/0103620 A1 | 4/2010 | Campbell et al. | |
| 2010/0108292 A1 | 5/2010 | Bhunia et al. | |
| 2010/0118494 A1 | 5/2010 | Campbell et al. | |
| 2010/0170657 A1 | 7/2010 | Kaslusky | |
| 2010/0328889 A1 | 12/2010 | Campbell et al. | |
| 2011/0026776 A1 | 2/2011 | Liang et al. | |
| 2011/0028617 A1 | 2/2011 | Hill et al. | |
| 2011/0267768 A1 | 11/2011 | Attlesey | |
| 2011/0284194 A1 * | 11/2011 | Sarkar | F28F 3/10 427/314 |
| 2011/0286177 A1 | 11/2011 | Attlesey | |
| 2011/0317367 A1 | 12/2011 | Campbell et al. | |
| 2012/0007579 A1 | 1/2012 | Apblett et al. | |
| 2012/0014064 A1 | 1/2012 | St. Rock et al. | |
| 2012/0058588 A1 | 3/2012 | Mayer et al. | |

(56) References Cited

U.S. PATENT DOCUMENTS

| | | |
|---|---|---|
| 2012/0075797 A1 | 3/2012 | Attlesey |
| 2012/0120599 A1* | 5/2012 | Chua .................. H01L 23/473 |
| | | 361/689 |
| 2012/0193068 A1 | 8/2012 | Nemesh et al. |
| 2013/0105120 A1 | 5/2013 | Campbell et al. |
| 2014/0123492 A1 | 5/2014 | Campbell et al. |
| 2014/0216688 A1 | 8/2014 | Shelnutt et al. |
| 2014/0218845 A1 | 8/2014 | Peng et al. |
| 2014/0218861 A1 | 8/2014 | Shelnutt et al. |
| 2014/0321054 A1 | 10/2014 | Kaefer et al. |
| 2015/0061568 A1 | 3/2015 | Martinez |
| 2015/0109730 A1 | 4/2015 | Campbell et al. |
| 2015/0237767 A1 | 8/2015 | Shedd et al. |
| 2015/0330718 A1 | 11/2015 | Rock et al. |
| 2016/0021793 A1 | 1/2016 | Chen |
| 2016/0120059 A1* | 4/2016 | Shedd ..................... F28F 3/12 |
| | | 165/244 |
| 2016/0305565 A1* | 10/2016 | Miller .................. F16K 43/00 |
| 2016/0330874 A1 | 11/2016 | Sato et al. |
| 2016/0360637 A1 | 12/2016 | Harvilchuck et al. |
| 2016/0366792 A1 | 12/2016 | Smith |
| 2017/0105313 A1 | 4/2017 | Shedd et al. |
| 2017/0127565 A1 | 5/2017 | Campbell et al. |
| 2017/0181328 A1 | 6/2017 | Shelnutt et al. |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1* | 1/2018 | Wakino .............. H05K 7/20772 |
| | | 361/699 |
| 2018/0042138 A1 | 2/2018 | Campbell et al. |
| 2018/0070477 A1 | 3/2018 | Saito |
| 2018/0084671 A1 | 3/2018 | Matsumoto et al. |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1 | 11/2018 | Wei et al. |
| 2019/0014685 A1 | 1/2019 | So et al. |
| 2019/0090383 A1 | 3/2019 | Tufty et al. |
| 2019/0098796 A1 | 3/2019 | Wakino et al. |
| 2019/0218101 A1* | 7/2019 | Huang .................. H01L 23/373 |
| 2019/0223324 A1 | 7/2019 | Le et al. |
| 2019/0297747 A1 | 9/2019 | Wakino et al. |
| 2020/0025451 A1 | 1/2020 | Stone et al. |
| 2020/0093037 A1 | 3/2020 | Enright et al. |
| 2020/0095667 A1 | 3/2020 | Sakamoto et al. |
| 2020/0150731 A1 | 5/2020 | Wang et al. |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1 | 12/2021 | Manousakis et al. |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1 | 2/2023 | Gao |
| 2024/0152163 A1 | 5/2024 | Heger et al. |

FOREIGN PATENT DOCUMENTS

| | | |
|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | I 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020/234600 A1 | 11/2020 |
| WO | 2020223806 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.

"IBM's Hot-Water Supercomputer Goes Live", Data Center Knowledge, retrieved on Jul. 19, 2021, 9 pages.

Extended European Search Report with regard to the EP Patent Application No. 21306771.3 completed May 23, 2022.

Extended European Search Report with regard to the EP Patent Application No. 21306173.2 completed Feb. 18, 2022.

Extended European Search Report with regard to the EP Patent Application No. 21306174.0 completed Feb. 14, 2022.

Extended European Search Report with regard to the EP Patent Application No. 21306172.4 completed Feb. 15, 2022.

English Abstract for JP2020065002 retrieved on Espacenet on Jun. 2, 2022.

Extended European Search Report with regard to the EP Patent Application No. 21306186.4 completed Feb. 10, 2022.

Extended European Search Report with regard to the EP Patent Application No. 21306187.2 completed Feb. 10, 2022.

Extended European Search Report with regard to the EP Patent Application No. 21306175.7 completed Apr. 8, 2022.

Extended European Search Report with regard to the EP Patent Application No. 21306188.0 completed Feb. 10, 2022.

English Abstract for JPH043451 retrieved on Feb. 22, 2022.

Extended European Search Report with regard to the EP Patent Application No. 21306171.6 completed Feb. 11, 2022.

(56) References Cited

OTHER PUBLICATIONS

Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL 1006486 retrieved on Espacenet on Jun. 3, 2022.
Extended European Search Report with regard to the counterpart EP Patent Application No. 22305018.8 completed Jun. 24, 2022.
Office Action with regard to the counterpart U.S. Appl. No. 17/697,452 mailed May 11, 2023.
Office Action with regard to the counterpart U.S. Appl. No. 17/701,422 mailed Mar. 28, 2023.
International Search Report and Written Opinion with regard to PCTIB2022053071 mailed Jun. 28, 2022.
International Search Report and Written Opinion with regard to PCT/IB2022/052975 mailed Jun. 20, 2022.
International Search Report and Written Opinion with regard to PCTIB2022052330 mailed May 30, 2022.
International Search Report and Written Opinion with regard to PCT/IB2022/052976 mailed Jun. 17, 2022.
International Search Report and Written Opinion with regard to PCT/IB2022/052977 mailed Jun. 20, 2022.
European Search Report with regard to EP21306170.8 completed Feb. 12, 2022.
European Search Report with regard to EP21306189.8 completed Feb. 10, 2022.
Office Action with regard to the counterpart U.S. Appl. No. 17/697,264 mailed Nov. 22, 2023.
Office Action with regard to the counterpart U.S. Appl. No. 17/697,452 mailed Nov. 22, 2023.
Office Action with regard to the counterpart U.S. Appl. No. 17/694,765 mailed Dec. 21, 2023.
Office Action with regard to te counterpart CN Patent Application No. 2022103375051 issued May 11, 2024.
Office Action with regard to the counterpart U.S. Appl. No. 17/698,037 mailed Feb. 26, 2024.
Office Action with regard to the counterpart U.S. Appl. No. 17/697,616 mailed Feb. 26, 2024.
Notice of Allowance with regard to the counterpart U.S. Appl. No. 17/690,839 mailed Mar. 5, 2024.
Office Action with regard to te counterpart U.S. Appl. No. 17/690,839 issued Jun. 25, 2024.
Office Action with regard to the counterpart U.S. Appl. No. 17/690,833 mailed Mar. 28, 2024.
Office Action with regard to the counterpart U.S. Appl. No. 17/697,452 mailed Mar. 25, 2024.
Notice of Allowance with regard to the counterpart U.S. Appl. No. 17/707,200 issued Aug. 15, 2024.
Office Action with regard to the counterpart U.S. Appl. No. 17/697,452 issued Sep. 6, 2024.
Office Action with regard to the counterpart CN Patent Application No. 2022103478109 issued Aug. 30, 2024.
Notice of Allowance with regard to te counterpart U.S. Appl. No. 17/697,616 issued Jul. 23, 2024.
Office Action with regard to te counterpart CN Patent Application No. 2022103326074 issued Jul. 29, 2024.
Office Action with regard to the counterpart CN Patent Application No. 2022103375314 issued Aug. 12, 2024.

* cited by examiner

LIQUID COOLING DEVICE MOUNTED ON A HEAT GENERATING ELECTRONIC COMPONENT

CROSS-REFERENCE TO RELATED APPLICATIONS

The present patent application claims priority from European Patent Application Number 21305427.3, filed on Apr. 1, 2021, and European Patent Application Number 21306175.7, filed on Aug. 30, 2021, the disclosures of which are incorporated by reference herein in their entirety.

TECHNICAL FIELD

The present technology relates to cooling devices for cooling electronic components of electronic equipment in computing infrastructures, such as but not limited to water blocks.

BACKGROUND

Electronic equipment, for example servers, memory banks, computer discs, and the like, is conventionally grouped in equipment racks. Large data centers and other large computing infrastructures may contain thousands of racks supporting thousands or even tens of thousands of servers and other electronic equipment.

The electronic equipment mounted in the racks consumes large amounts of electric power and generates significant amounts of heat. Cooling needs are important in such racks. Some electronic equipment, such as processors, generate so much heat that they could fail within seconds in case of a lack of cooling. Moreover, with advancing technological progress, electronic equipment for computing purposes is not only becoming more performant but also has a greater associated thermal design power (TDP) (i.e., a maximum amount of heat generated thereby which a cooling system should dissipate) thus emphasizing the need to improve cooling solutions.

Forced air-cooling has been traditionally used to disperse heat generated by such electronic equipment mounted in the racks. Air-cooling requires the use of powerful fans, and the provision of space between the electronic equipment or between electronic components of a given electronic equipment. The space is used for placing heat sinks and for allowing sufficient airflow. However, such forced air-cooling methods are generally not very efficient.

Water-cooling technologies are increasingly used as an efficient and cost-effective solution to maintain safe operating temperatures of electronic equipment, such as servers, mounted in racks. Such water-cooling technologies include water cooling systems, such as water blocks, which are mounted on the heat-generating electronic equipment or on the electronic component of the electronic equipment. Notably, a water block, which is a water cooling heat sink, is thermally coupled to the electronic component of the electronic equipment to be cooled (e.g., the processor of the server) by a thermal paste. A heat-transfer fluid flows through an internal conduit of the water block to collect thermal energy from the electronic component. The collected thermal energy may be further directed elsewhere to be dissipated, for example external dry coolers.

However, in some cases, the heat dissipation provided by the water block may not be sufficient. As noted above, even a temporary insufficiency of water-cooling solutions may lead to loss of service and permanent damage in data centers and other large computing infrastructures.

There is therefore a desire for a water block which can alleviate at least some of these drawbacks.

SUMMARY

It is an object of the present technology to ameliorate at least some of the inconveniences present in the prior art.

Developers have noted that immersion technologies in combination with water block cooling may have an enhanced cooling effect. Immersion cooling typically comprises submerging the electronic equipment including the electronic component in an immersion cooling liquid, which is a thermally conductive liquid which removes heat from the heat-generating electronic component(s). However, conventionally used immersion cooling liquids comprise dielectric liquids, such as hydrocarbons or fluorocarbons, which are chemically incompatible with conventionally used thermal pastes used with the water blocks.

The purpose of thermal paste used in water block cooling is to increase a contact of the surfaces of the electronic component and the water block by filling in micro-gaps and compensating for uneven surfaces. Thermal pastes typically include a bonding component such as silicones, urethanes, epoxies and acrylates mixed with a thermally conductive component such as metal, ceramic or mineral particles. These are inexpensive and readily available. However, they are chemically incompatible with the immersion cooling liquid.

Another type of thermal paste used with water blocks are metal liquids or foils, such as Indium foil. Although these materials are compatible with the immersion cooling liquid, they are significantly more expensive than the conventional thermal pastes. For example, Indium foil for use with a water block to cool a CPU costs about 100 times more than conventional thermal paste. Furthermore, there are concerns as to the sustainability of Indium as it is mined metal and a finite resource.

Developers have addressed these above-noted problems with a solution that provides a water block that can be used in immersion cooling and in which contact between the immersion cooling liquid and the thermal paste is avoided. Therefore, chemically incompatible combinations of the immersion cooling liquid and the thermal paste can be used without fear of chemical breakdown of either material as contact will be avoided. More specifically, the use of expensive and rare Indium as thermal paste can be avoided.

Broadly, aspects of the water block of the present technology provide a fluid sealing of a surface on which the thermal paste will be applied from the immersion cooling liquid when the water block is mounted to an electronic component and submerged in the immersion cooling liquid.

Accordingly, embodiments of the present technology can provide cost effective and sustainable enhanced cooling of electronic components using a combination of water block and immersion technologies.

According to one aspect of the present technology, there is provided a cooling device mountable on an electronic component, the cooling device comprising: a body having an internal fluid conduit for allowing a heat-transfer fluid to flow therethrough, the body comprising: a first surface configured for mounting on the electronic component and permitting thermal transfer therethrough, a second surface; at least one side wall extending between the first surface and the second surface; and a gasket extending along the at least one side wall and/or the first surface, the gasket configured to extend away from the body beyond the first surface in a direction transverse thereto, to fluidly insulate the first surface when the first surface is mounted on the electronic component and submerged in the immersion cooling liquid in use. The cooling device may be a water block.

In some embodiments, the at least one side wall and/or the first surface includes a channel formed therein, the channel being sized and shaped to house the gasket. The channel may be an open channel configured to house the gasket such that a portion of the gasket extends therefrom to seal the first surface.

In some embodiments, the channel has a width which is larger than a depth of the channel.

In some embodiments, the channel is defined by a channel wall having at least one linear or curved channel wall portion. In some embodiments, the channel wall has a first channel wall portion and a second channel wall portion which is generally transverse to the first channel wall portion.

In some embodiments, the first surface has a first surface area which is smaller than a second surface area of the second surface.

In some embodiments, the gasket is made of an elastomeric material. The gasket may be resiliently deformable. The gasket may have a circular or quadrilateral cross-sectional profile.

In some other embodiments, the gasket is made of an epoxy material. The gasket may be formed by applying the epoxy on the side wall when the cooling device is mounted on the electronic component and allowing it to polymerize.

In some embodiments, the gasket is of one piece construction.

In some embodiments, one or both of the gasket and the body is made of a material resilient to immersion cooling liquid.

In some embodiments, the cooling device further comprises a thermal paste on the first surface, the gasket configured to fluidly insulate the thermal paste when the first surface is mounted on the electronic component.

In some embodiments, the thermal paste does not contain indium.

In some embodiments, the first surface is on an opposite side of the body to the second surface.

In some embodiments, the body has a cold inlet and a hot outlet extending through the first surface or the second surface.

In some embodiments, the body has a body perimeter shape selected from a rectangle, a square and a circle. When the body perimeter shape is a rectangle, the at least one side wall may comprise four side walls defining the body perimeter.

In some embodiments, the heat transfer fluid flowing in the internal fluid conduit is water.

From another aspect, there is provided a cooling system comprising: at least one cooling device as defined above; and an immersion case configured to immerse, in an immersion cooling liquid, an electronic component and the cooling device housed thereon.

In some embodiments, the cooling system further comprises an external fluid cooling unit configured to receive a flow of the heat-transfer fluid from the cooling device, the external fluid cooling system being adapted to dissipate heat from the heat-transfer fluid; and a pump adapted to maintain the flow of the heat-transfer fluid circulating in a cooling circuit, allowing to transfer thermal energy from the cooling device to the heat-transfer fluid and to transfer thermal energy from the heat-transfer fluid to the external cooling unit.

From another aspect, there is provided a method for cooling an electronic component, comprising: placing a cooling device as defined above on an electronic component such that the gasket fluidly seals the first surface of the cooling device; immersing the cooling device and the electronic component in immersion cooling liquid.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
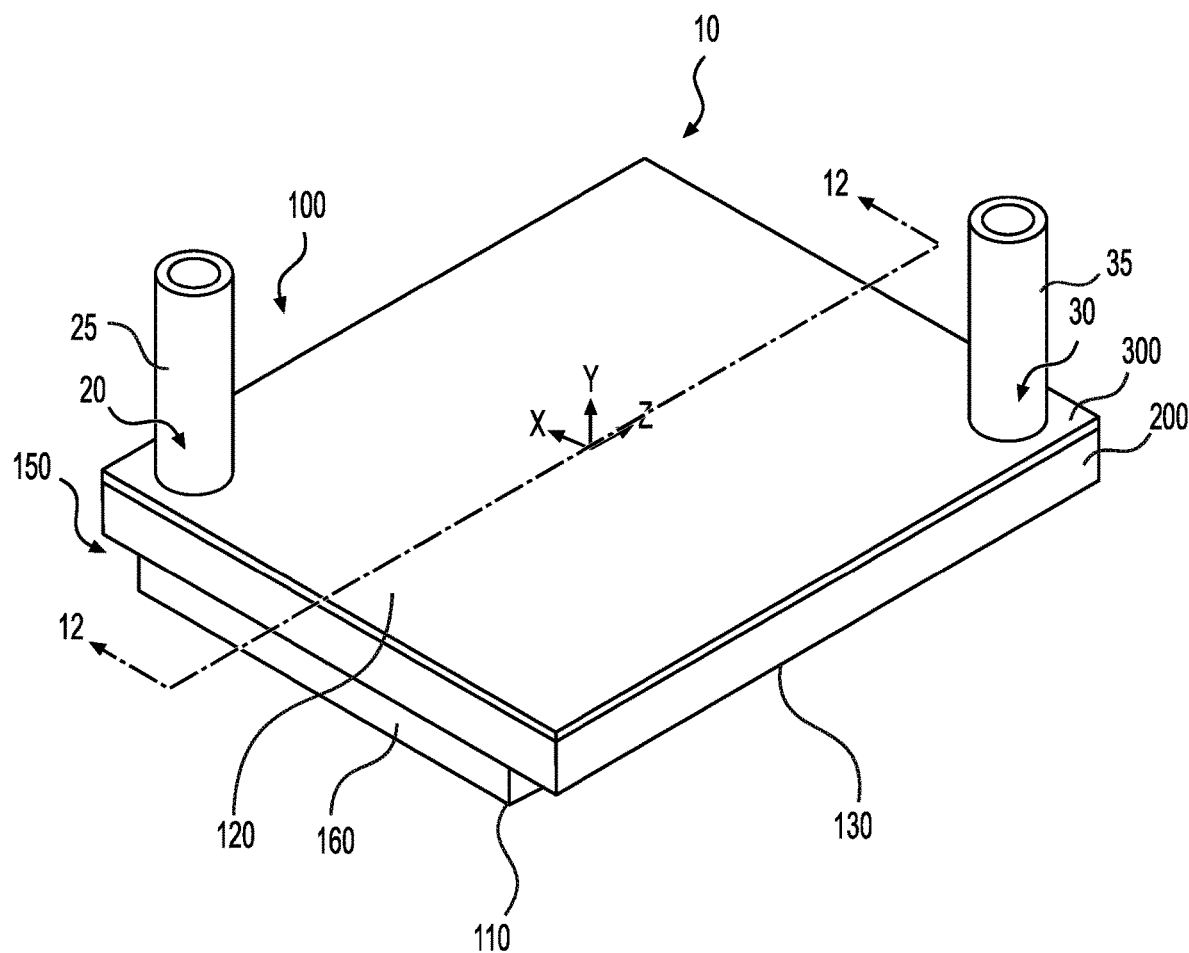
FIG. 1 is a perspective view of a water block with the gasket not shown for clarity, according to an embodiment of the present technology.

FIGS. 1 to 15 illustrate a cooling device which comprises a water block 10 in accordance with an embodiment of the present technology. The water block 10 is configured for cooling an electronic component 50, of an electronic equipment, which generates heat. In this example, the electronic component 50 is a central processing unit (CPU) of a computer system and is mounted to a motherboard thereof. In use, the CPU generates a significant amount of heat and, as is known, can benefit from cooling. It is contemplated that the electronic component 50 could be any other heat-generating electronic component to which a water block may be applied, such as a graphics processing unit (GPU), or an intermediary component disposed between the water block 10 and the electronic component 50. As will be described in further detail below, the water block 10 may be used in immersed cooling and is suitable for being submerged in an immersion cooling liquid.

As best seen in FIGS. 3, 4, 7, 8, 14 and 15, in use, the water block 10 is configured to be disposed atop the electronic component 50 for thermal contact with the electronic component 50 to allow the water block 10 to absorb heat therefrom.

More precisely, the water block 10 has a body 100 which defines an internal fluid conduit 15 (FIGS. 12-15) for circulating heat transfer fluid therein. There is provided a fluid inlet 20 in fluid communication with the internal fluid conduit 15 for feeding the heat transfer fluid to the internal fluid conduit 15 and a fluid outlet 30 in fluid communication with the internal fluid conduit 15 for discharging the heat transfer fluid from the internal fluid conduit 15. In this embodiment, an inlet pipe 25 is connected to the fluid inlet 20, and an outlet pipe 35 is connected to the fluid outlet 30. In other embodiments, respective inlet and outlet connectors (not shown) may be fluidly connected between the pipes 25, 35 and the fluid inlet and outlet 20, 30.

The heat transfer fluid may comprise any fluid suitable for heat transfer purposes, such as water, refrigerant, or dielectric fluid. As such, it is to be understood that the term "water block" is intended to include such water blocks that use fluids other than water and/or multiphase flow (e.g., two-phase flow). For example, in some instances, the fluid may be an oil, an alcohol, or a dielectric fluid (e.g., 3M Novec®).

The body 100 has a first surface 110, a second surface 120, and side walls 130 extending between the first surface 110 and the second surface 120. The side walls 130 define a perimeter of the body. The first and second surfaces 110, 120 are on opposites sides of the body 100. In certain embodiments, the first and second surfaces 110, 120 are generally parallel to one another. In the "in use" configuration shown in the figures, the water block 10 is mounted to the electronic component 50 in a horizontal configuration with the first surface 110 and the second surface 120 disposed horizontally. In such cases, the first surface 110 can also be referred to as a "lower surface" and the second surface 120 can be referred to as an "upper surface". It will be appreciated that in other embodiments, the water block 10 may be disposed in a different manner in use, such as a vertical configuration in which the first and second surfaces 110, 120 are oriented vertically.

The first surface 110 is configured to be in contact with the electronic component 50 via a thermal paste 140 (FIGS. 3, 7, 14 and 15) for thermal transfer therewith. The thermal paste 140 may be applied to the first surface 110 in a manner that is known in the art, to ensure adequate heat transfer between the electronic component 50 and the first surface 110. In certain embodiments, the first surface 110 may be configured to directly contact the electronic component, without a thermal paste therebetween, for thermal transfer with the electronic component 50. It is to be understood that in this context, the first surface 110 is said to be "in contact" with the electronic component 50 whether or not a thermal paste is applied between the first surface 110 and the electronic component 50.

The thermal paste 140 may be any suitable thermal paste which has adhesive and heat conducting properties. For example, the thermal paste 140 may have a composition having a bonding component and a particulate component. The particulate component may comprise particles of metal, minerals and/or ceramics. In an aspect of the present technology, any thermal paste 140 can be used with the water block 10, even when the water block 10 is submerged in immersion cooling liquid. More specifically, the thermal paste 140 may have a composition which is not chemically stable in the immersion cooling liquid. As a result, Indium foil is not required as a thermal paste for use with the water block 10 in immersed uses.

As illustrated in the embodiment of FIGS. 1-15, the first and second surfaces 110, 120 of the water block 10 are generally rectangular. In this respect, there are four side walls. In other embodiments, the first and second surfaces 110, 120 may have shapes different to those illustrated herein. For example, one or both of the first and second surfaces 110, 120 may be square or circular. As illustrated, the first surface 110 has a first surface area which is smaller than a second surface area of the second surface 120. In other embodiments, the body 100 may be trapezoidal, for example, such that the second surface area of the second surface is larger the first surface area of the first surface 110.

There is a channel 150 formed in the body 100, and more specifically at a junction of the side walls 130 and the first surface 110. The channel 150 may be considered as a continuous recess in the side walls 130 adjacent the first surface 110, or as a continuous recess in the first surface 110 adjacent the side walls 130. The channel 150 may be considered as an inset peripheral portion of the body at the first surface 110. The channel 150 defines a perimeter 160 of the first surface 110, as best seen in the plan view of the first surface 110 in FIG. 10.

In another embodiment (not shown), the channel 150 is formed on the first surface 110. In these embodiments, the channel 150 may define the perimeter of the first surface 110 or extend substantially parallel and be spaced from the perimeter of the first surface 110.

The channel 150 is defined by channel walls 152. It will be appreciated that the channel walls 152 can be considered as part of the side walls 130.

Figure 5:
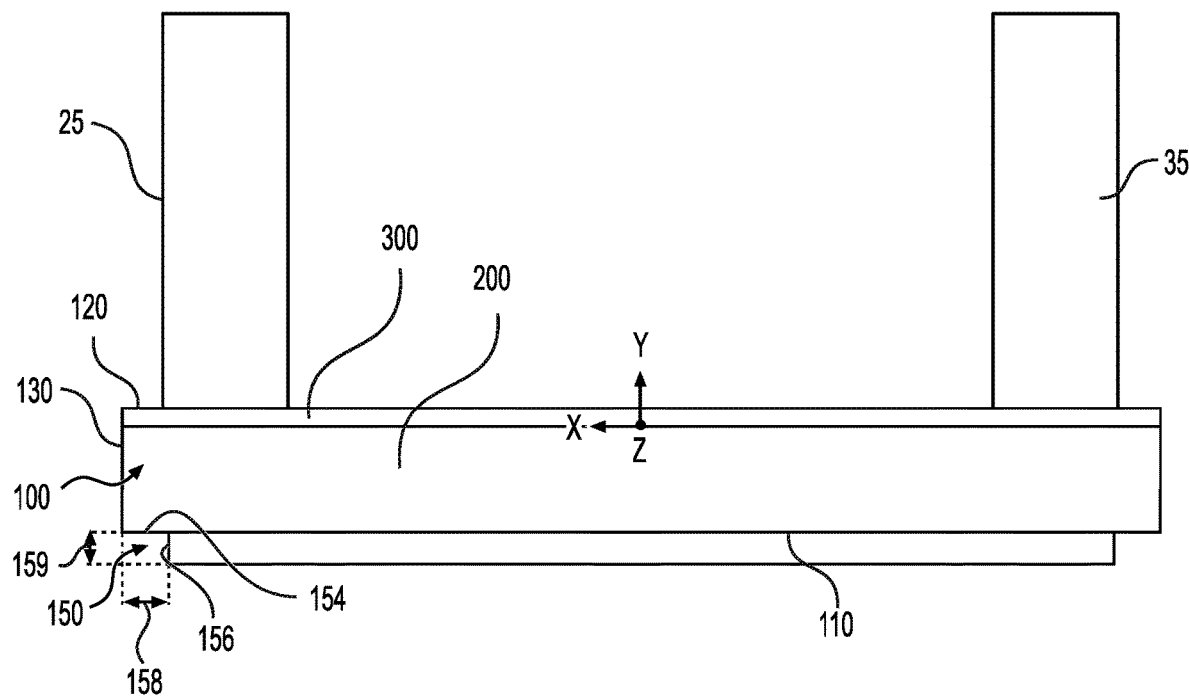
FIG. 5 is a front elevation view of the water block of FIG. 1.

In the embodiment illustrated in the figures and as best seen in FIG. 5, the channel wall 152 has a first channel wall portion 154 and a second channel wall portion 156. The first channel wall portion 154 has a first dimension 158 corresponding to a width of the channel 150. The second channel wall portion 156 has a second dimension 159 corresponding to a depth of the channel 150. The first and second channel wall portions 154, 156 are linear and generally transverse to one another.

In certain embodiments, the first dimension 158 of the channel 150 is more than the second dimension 159 of the channel.

In certain embodiments, the first dimension 158 is about 3.8 mm and the second dimension 159 is about 3.0 mm. In certain embodiments, a ratio of the first dimension 158 to the second dimension 159 of the channel 150 more than 1, or about 1.27 in certain embodiments. Without limitation, the ratio may range from about 1 to about 1.5.

It will be appreciated that the channel wall 152 may have any other suitable configuration. For example, instead of linear first and second channel wall portions 154, 156, the first and second channel wall portions 154, 156 may be curved. Instead of first and second channel wall portions 154, 156, the channel wall 152 may be continuous and have a curved configuration.

The channel 150 is formed in the base portion 200 of the body 100 in any suitable manner. For example, the channel 150 can be formed by milling by a milling machine (e.g., a numerically controlled mill), by molding by molding equipment or by machining using electro erosion, for example.

Figure 2:
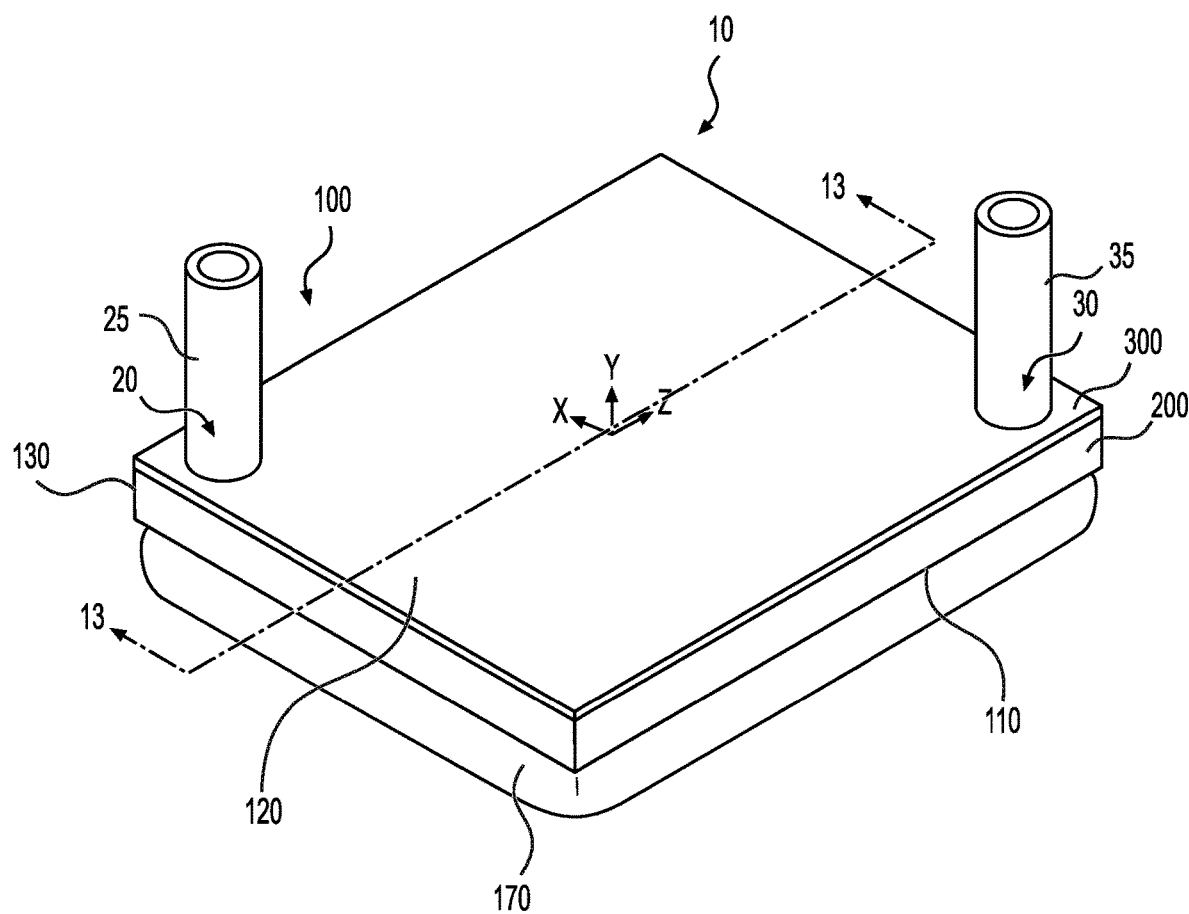
FIG. 2 is a perspective view of the water block of FIG. 1 with the gasket shown, according to an embodiment of the present technology.
Figure 3:
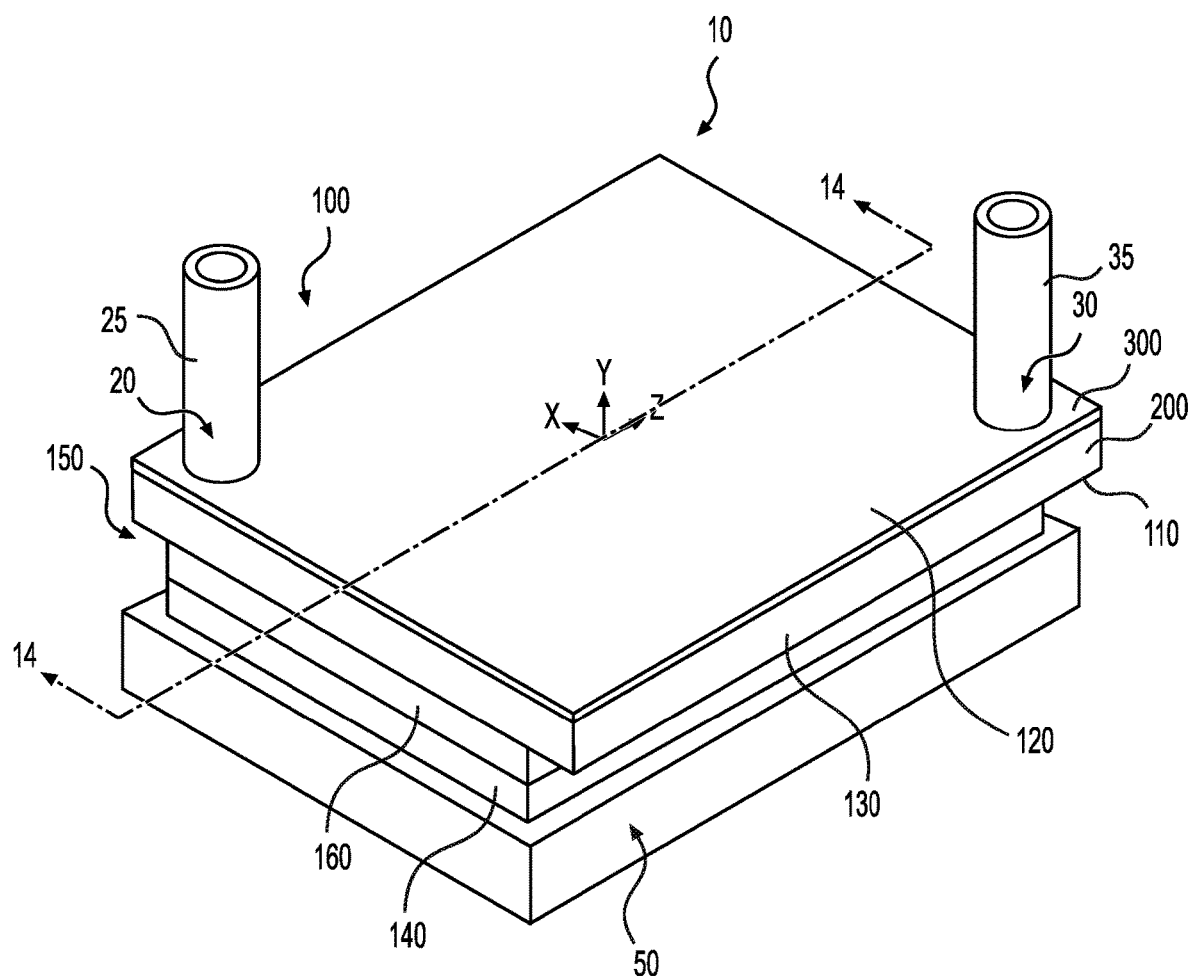
FIG. 3 is a perspective view of the water block of FIG. 1 mounted to an electronic component, according to an embodiment of the present technology.
Figure 4:
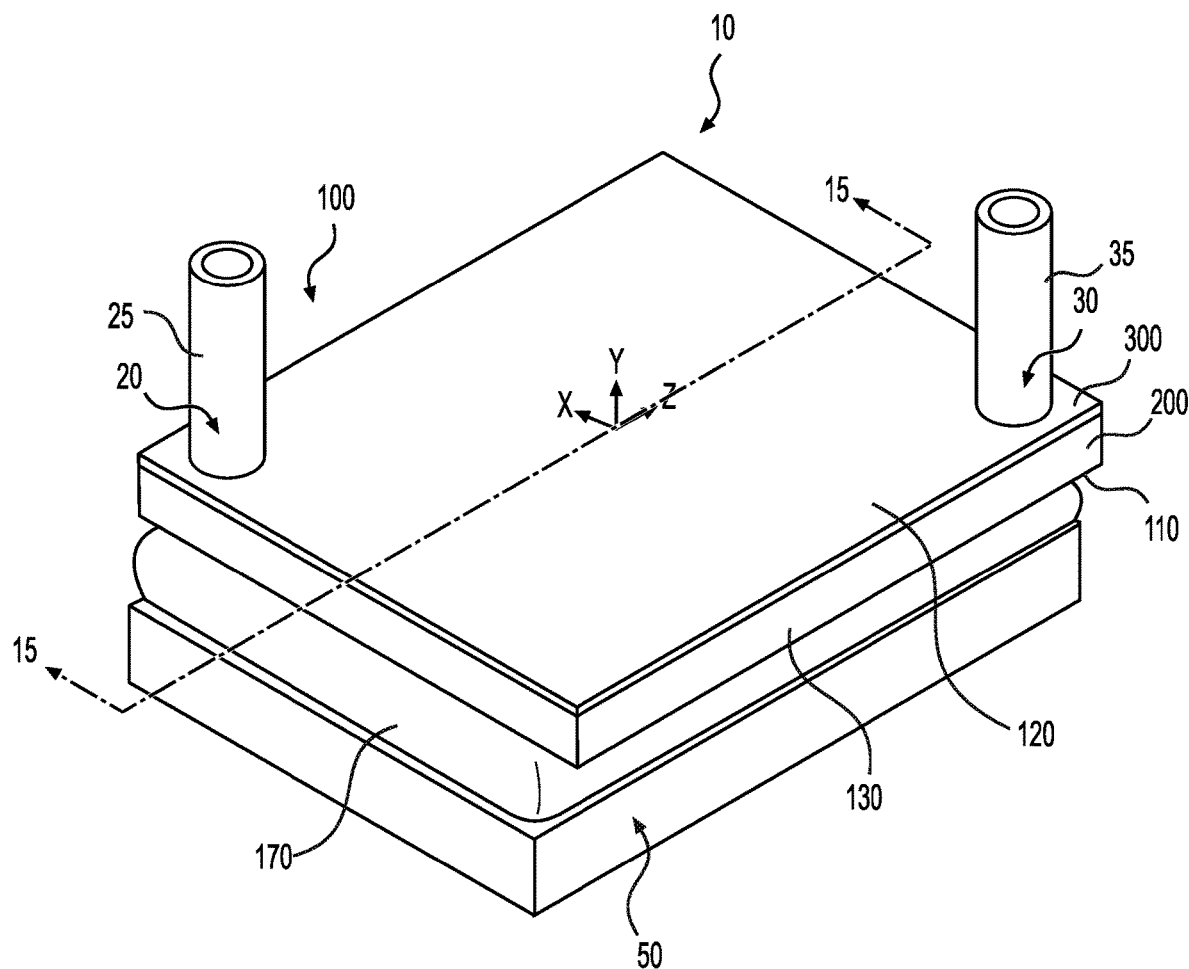
FIG. 4 is a perspective view of the water block of FIG. 2 mounted to an electronic component, according to an embodiment of the present technology.
Figure 6:
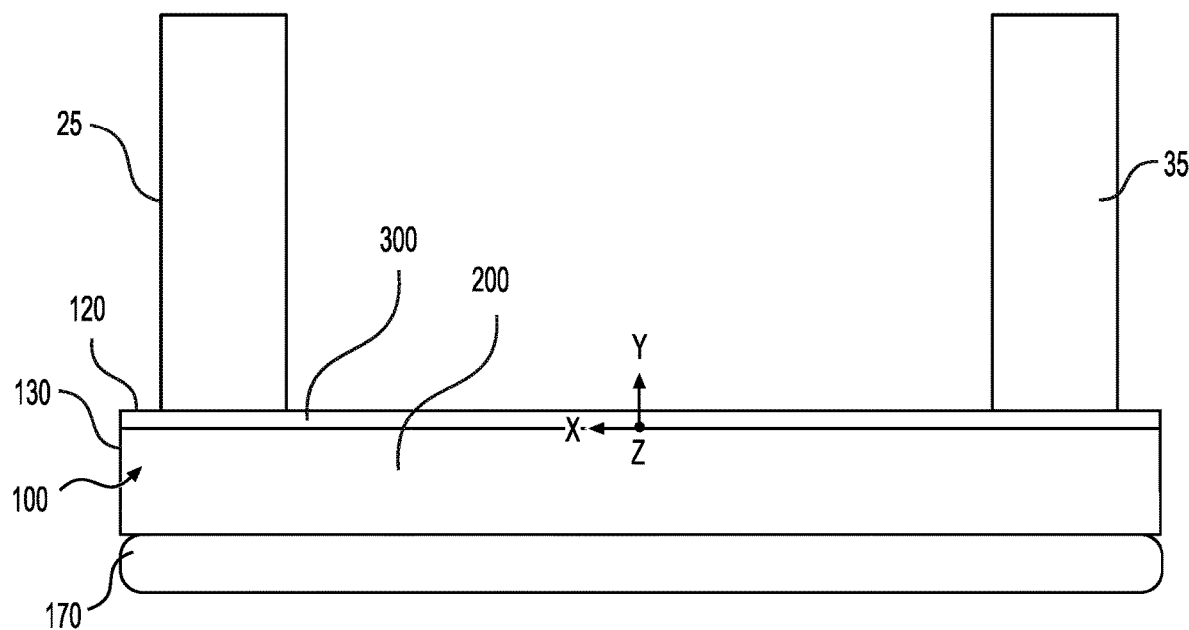
FIG. 6 is a front elevation view of the water block of FIG. 2.
Figure 7:
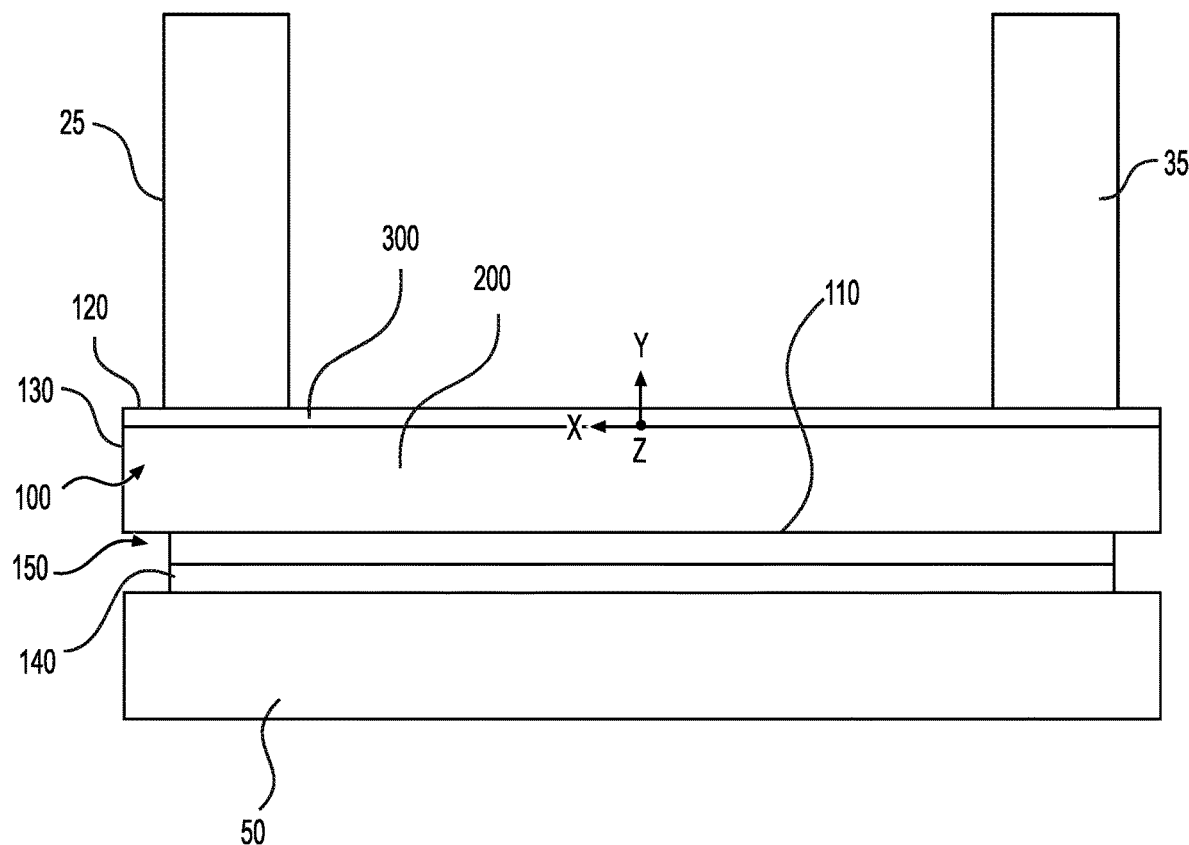
FIG. 7 is a front elevation view of the water block of FIG. 3.
Figure 8:
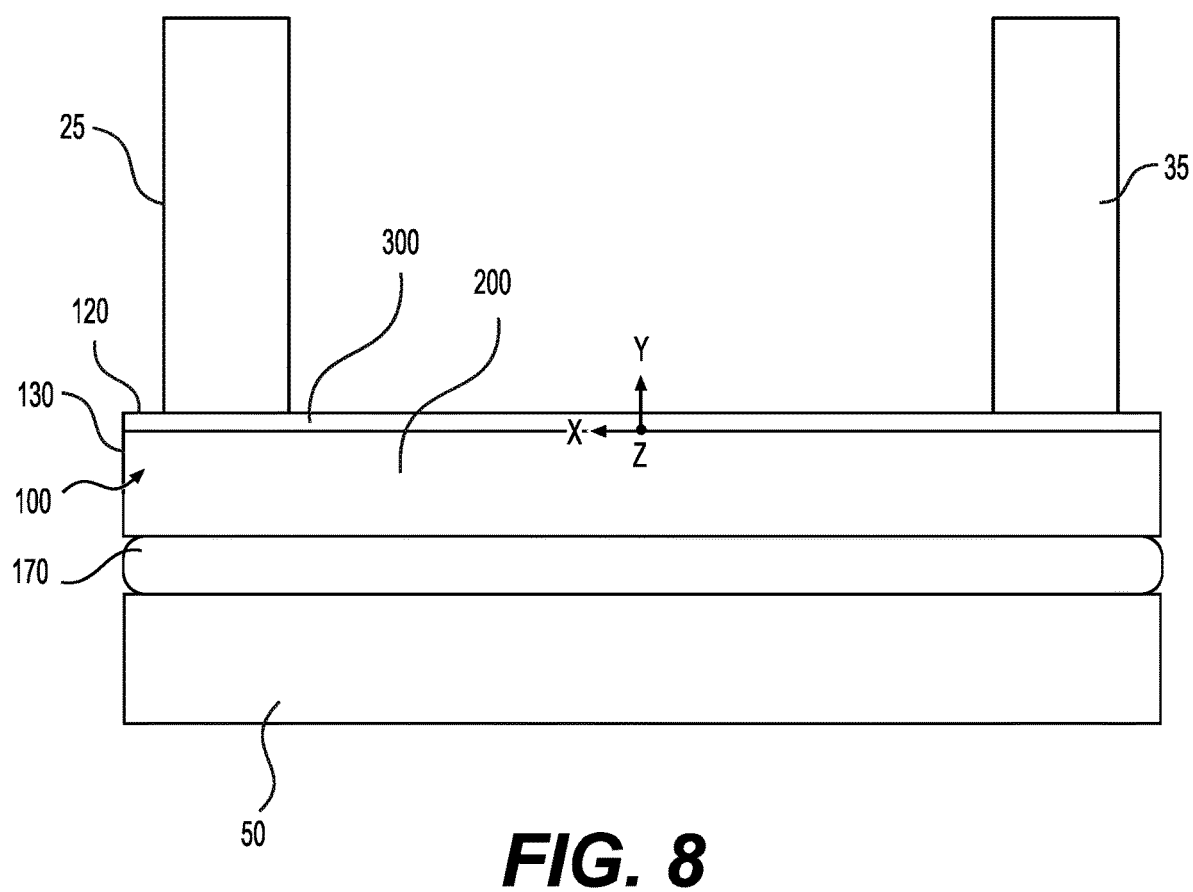
FIG. 8 is a front elevation view of the water block of FIG. 4.
Figure 9:
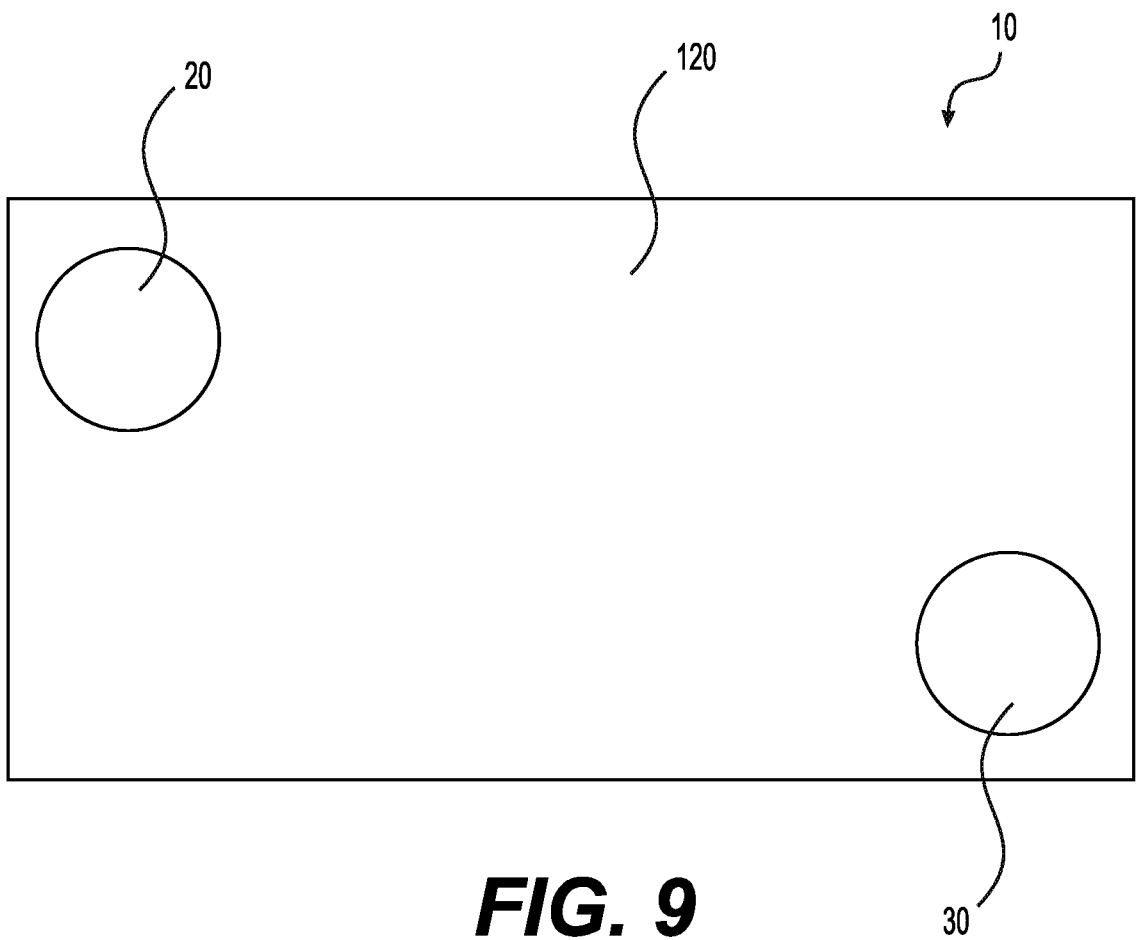
FIG. 9 is a top plan view of the water block of FIG. 1.
Figure 10:
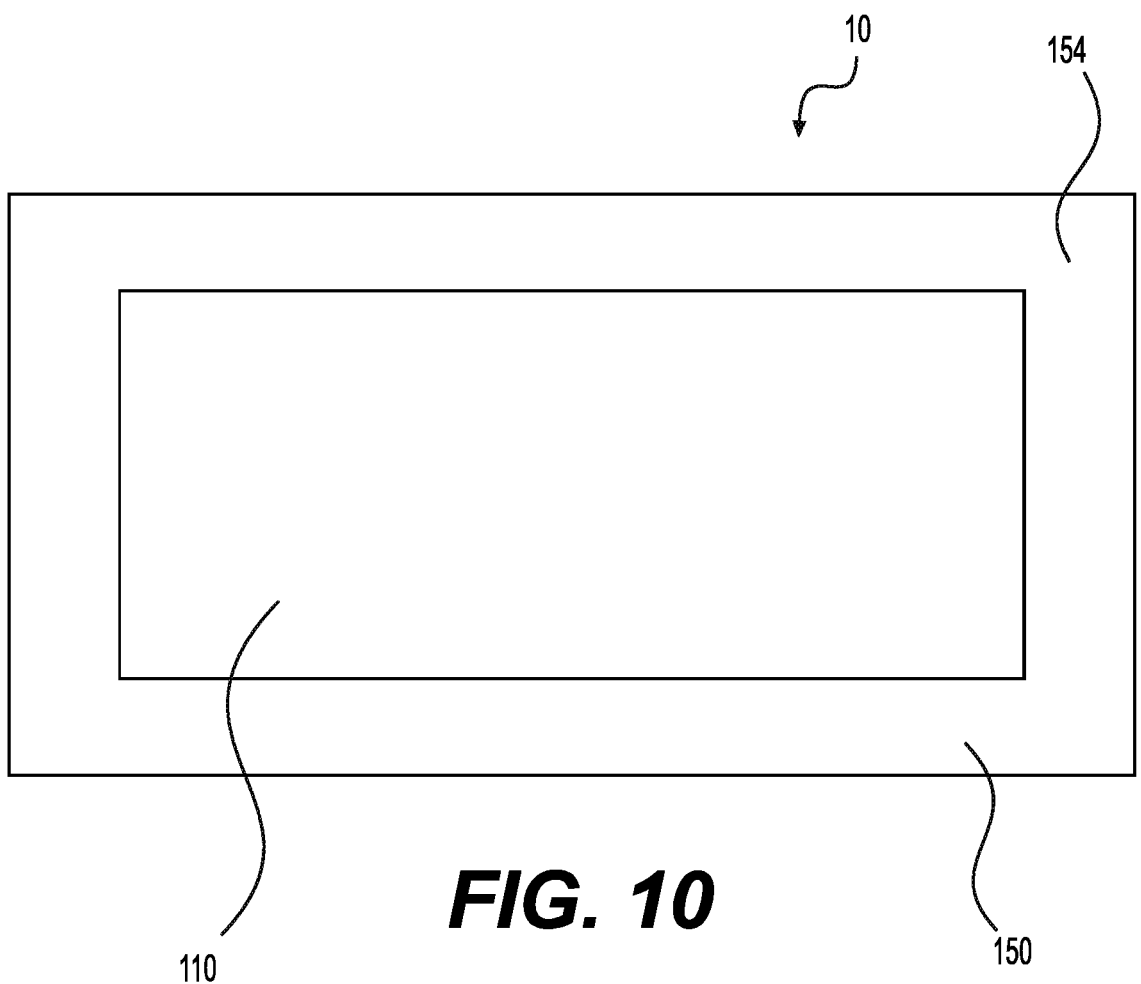
FIG. 10 is a bottom plan view of the water block of FIG. 1.
Figure 11:
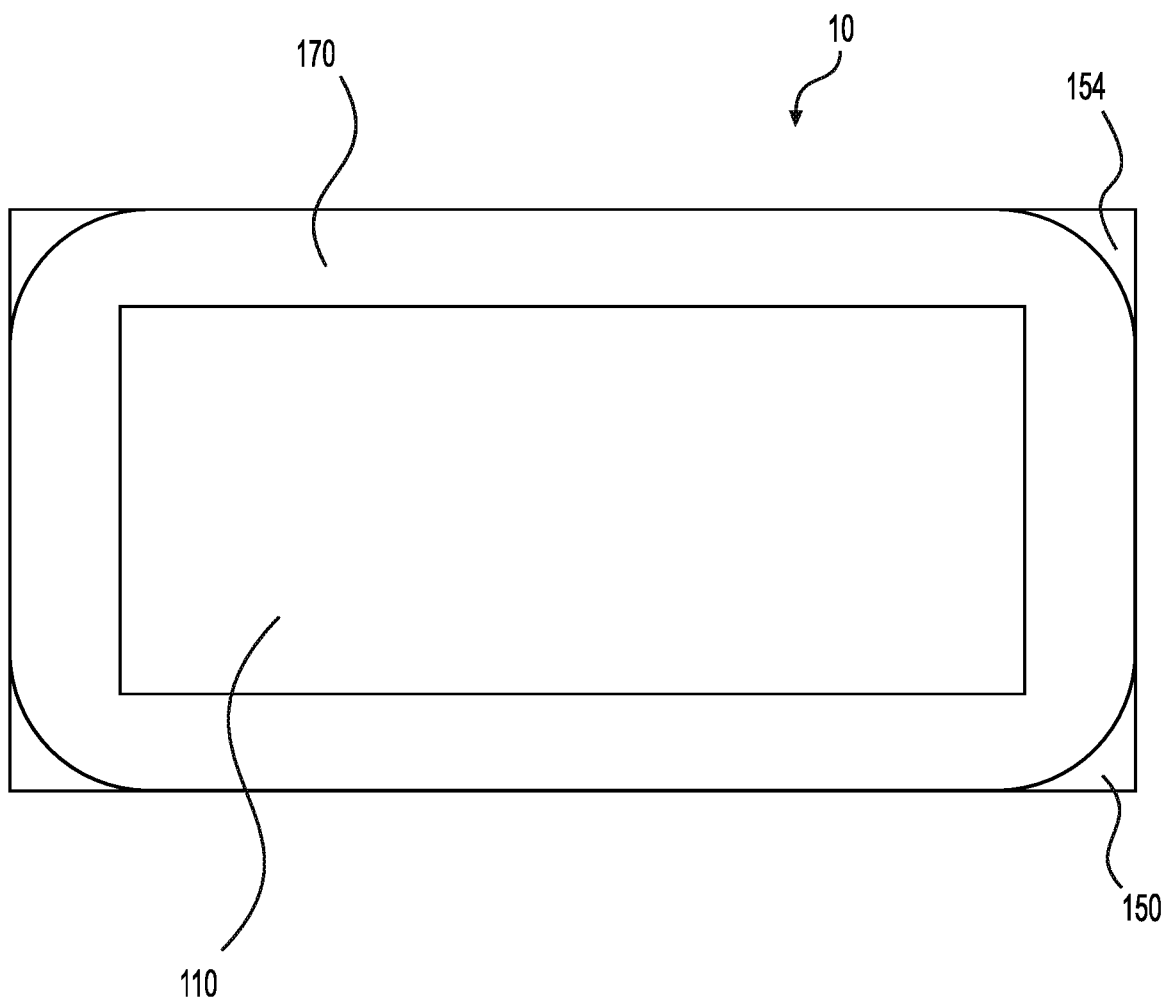
FIG. 11 is a bottom plan view of the water block of FIG. 2.
Figure 12:
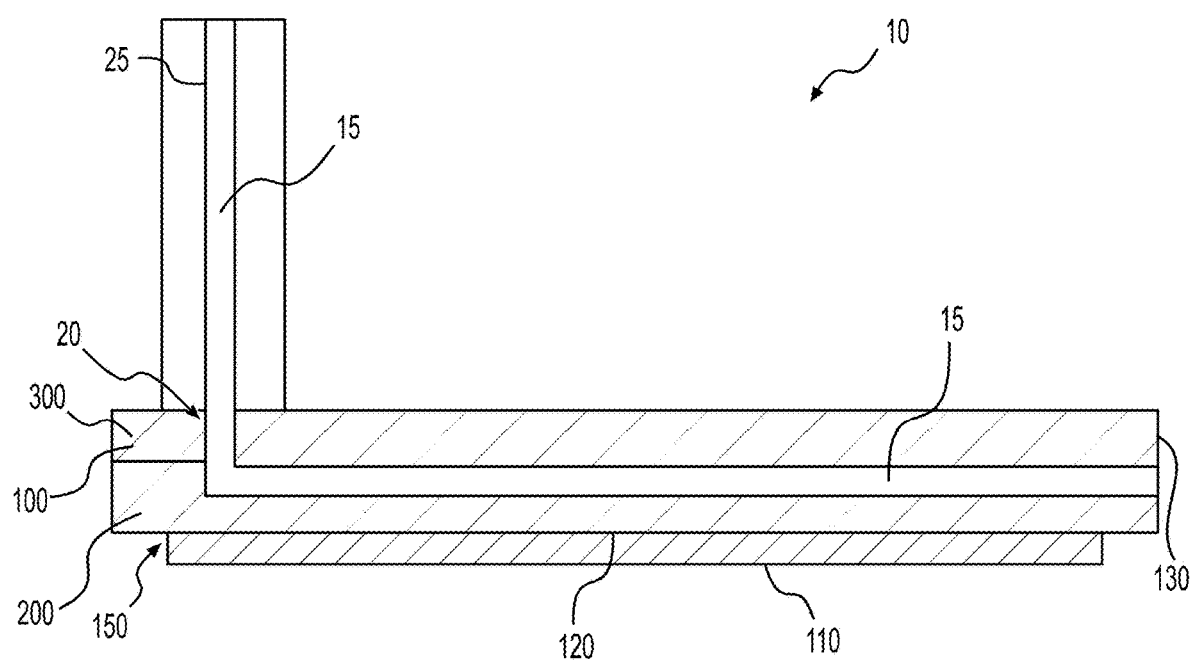
FIG. 12 is a cross-sectional view of the water block of FIG. 1, taken along line 12-12 in FIG. 1.
Figure 13:
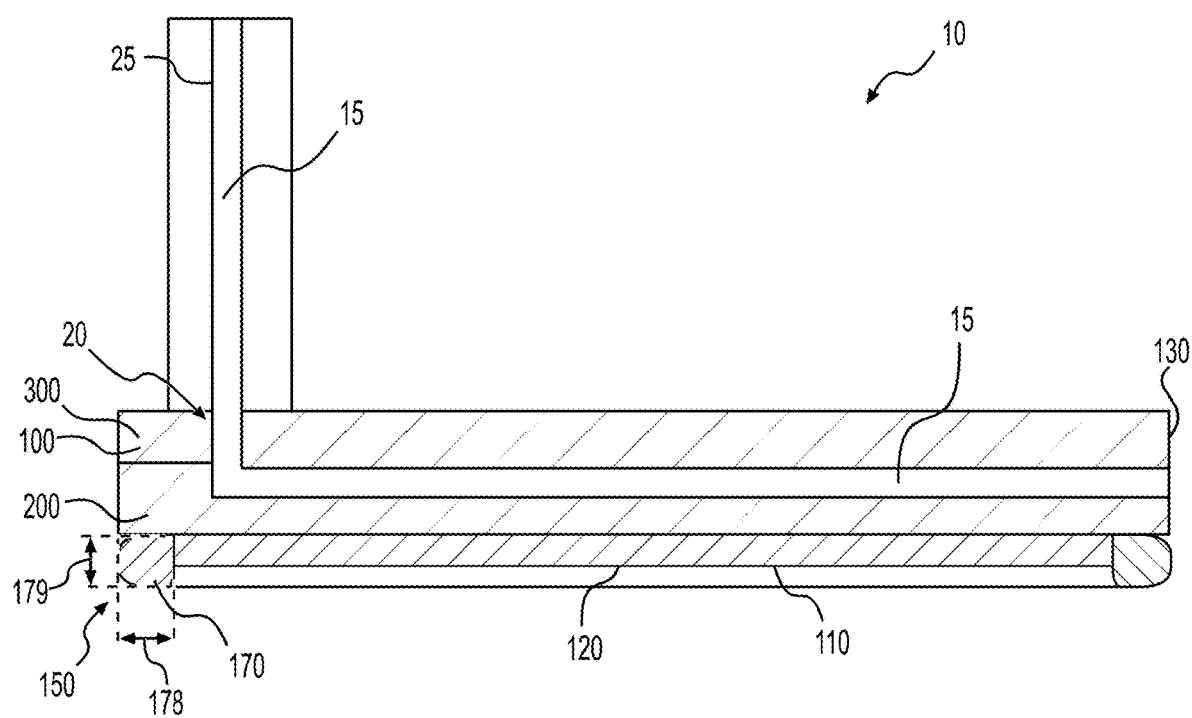
FIG. 13 is a cross-sectional view of the water block of FIG. 2 taken along line 13-13 in FIG. 2.
Figure 14:
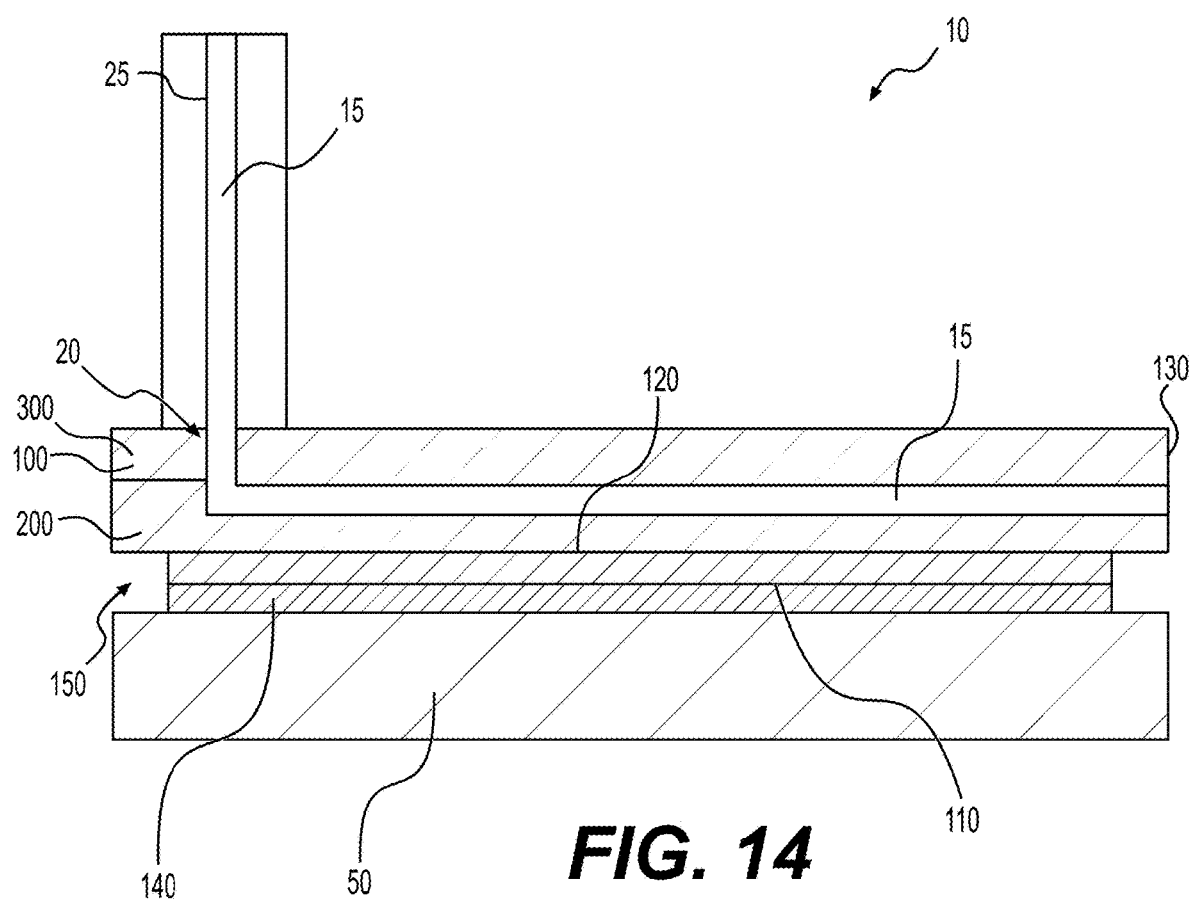
FIG. 14 is a cross-sectional view of the water block of FIG. 3 taken along line 14-14 in FIG. 3.

The channel 150 is configured to house a gasket 170. As seen in FIGS. 2, 6 and 13, the channel 150 is an open channel such that a portion of the gasket 170 extends from the channel 150, when the gasket 170 is housed in the channel 150. At least a portion of the gasket 170 is configured to extend beyond the first surface 110, in a direction substantially transverse thereto, to fluidly seal the first surface 110 when the first surface 110 contacts the electronic component 50 in use.

In the embodiment in which the channel 150 is formed in the first surface 110 as opposed to the side walls 130, the gasket 170 is housed in the channel 150 At least a portion of the gasket 170 is configured to extend beyond the first surface 110, in a direction substantially transverse thereto, to fluidly seal the first surface 110 when the first surface 110 contacts the electronic component 50 in use.

When viewed in transverse cross-section (best seen in FIG. 13), the gasket 170 has a first gasket dimension 178 and a second gasket dimension 179. In certain embodiments, the first gasket dimension 178 is equal to or more than the second gasket dimension 179 (+/−2 mm). In certain embodiments, the second gasket dimension 179 is more than the second dimension 159 of the channel so that there is an overhang of a portion of the gasket beyond the channel 150.

The gasket 170 has a one piece construction and is sized and shaped to be housed in the channel 150. The gasket 170 is made of a material which is resilient to immersion cooling liquid. In certain embodiments, the gasket 170 may be made of a material such as chloroprene, fluorosilicone rubber, polytetrafluoroethylene (PTFE), fluoroelastomer, butadiene acylonitrile, or nitriles.

The gasket 170 is resiliently deformable in certain embodiments such that once it is in position in the channel 150 it can be stretched over a perimeter of the electronic component 50 to seal around the first surface 110, the thermal paste 140 and a surface of the electronic component 50 that faces the first surface 110. In certain embodiments, the gasket 170, when it is resiliently deformable, can be made of any elastomeric material.

In other embodiments, the gasket may comprise an epoxy resin, which may be applied to the channel 150 prior to polymerization as a liquid or a gel and allowed to polymerize in situ. The epoxy resin precursor may be applied to the channel 150 after the water block 10 has been mounted on the electronic component 50, so that it seals around the channel 150 and electronic component when polymerized.

Figure 15:
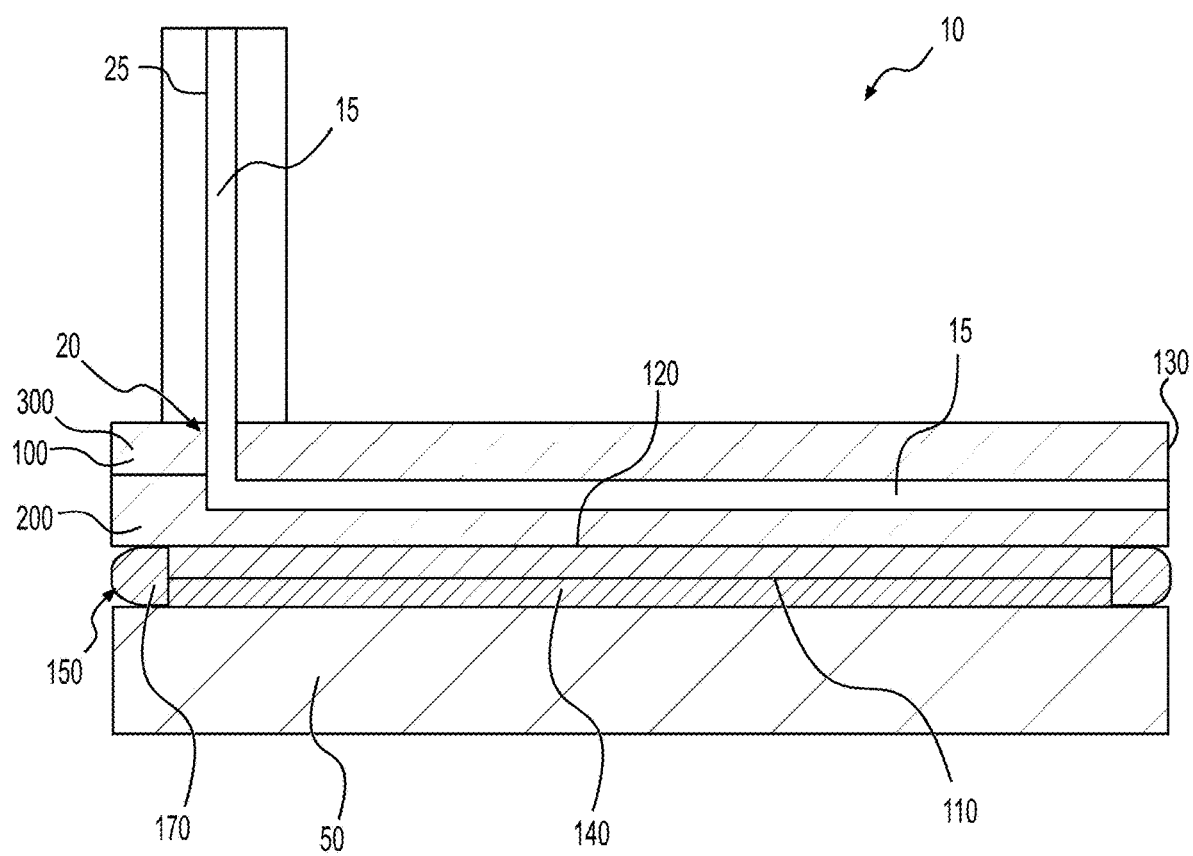
FIG. 15 is a cross-sectional view of the water block of FIG. 4 taken along line 15-15 in FIG. 4.

The gasket 170 may have any suitable cross-sectional profile. In FIGS. 13 and 15, the gasket 170 is illustrated as having a circular cross-sectional profile. However, in other embodiments, the cross-sectional profile of the gasket 170 may be any other shape, such as elongated, rectangular, oval etc. The gasket may have a flat tape-like configuration.

Figure 16:
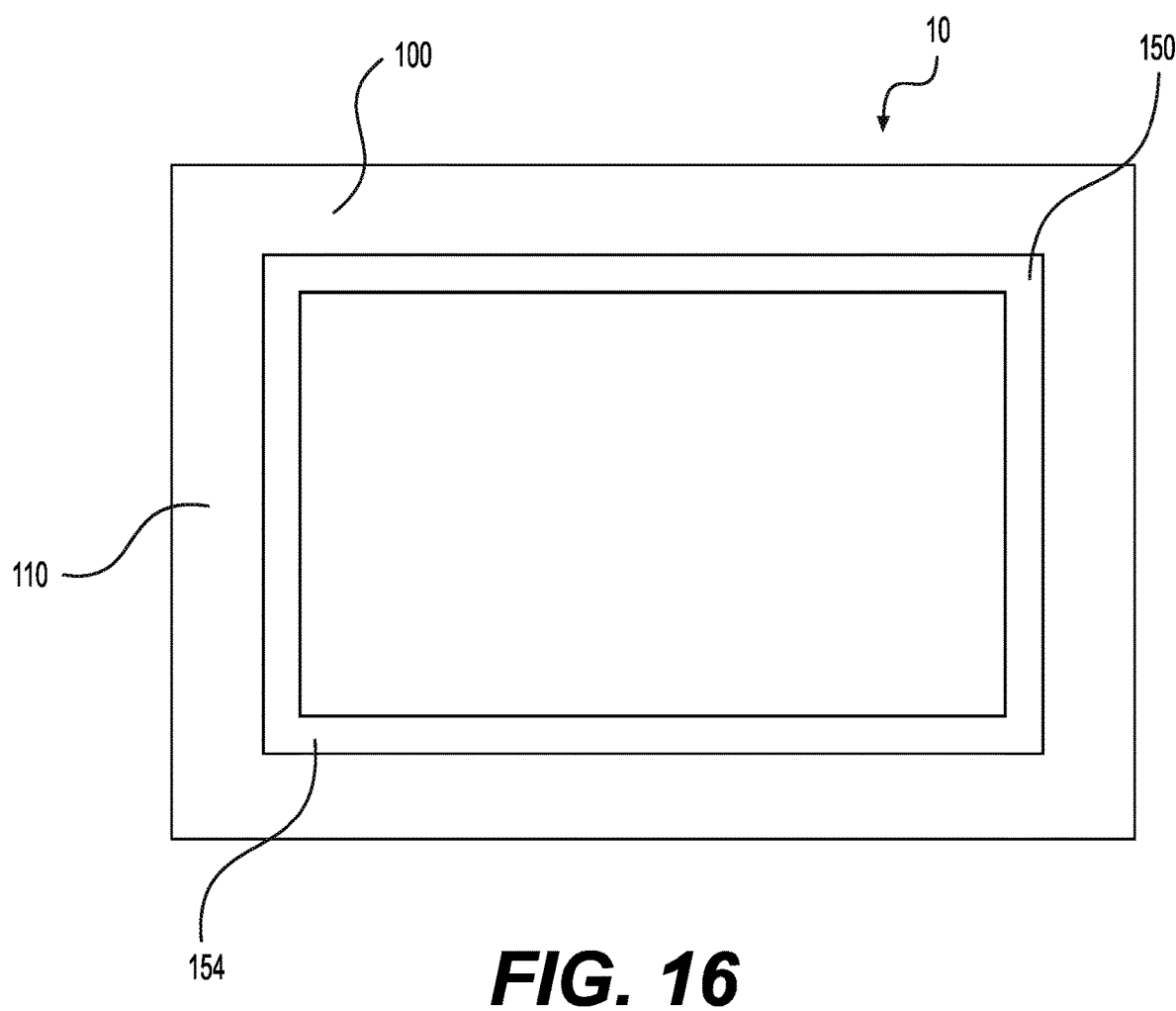
FIG. 16 is a bottom plan view of another embodiment of the water block of FIG. 2.

Referring to FIG. 16, there is shown an alternative embodiment of the water block 10 in which the channel 150 is defined fully within the first surface 110 instead of at a junction of the first surface 110 with the side walls 130. As before, the channel 150 is sized and shaped to receive the gasket 170 which is configured to fluidly seal a portion of the first surface 110 defined by the gasket 170. In the embodiment of FIG. 16, the channel 150 can be said to define a perimeter of the first surface 110 which is fluidly sealed in use when mounted onto the electronic component 50.

Referring back to the body 100, in this embodiment, the body 100 of the water block 10 has a two-part configuration: a cover portion 200 and a base portion 300 connected together. In use, the base portion 300 is disposed between the cover portion 200 and the electronic component 50. The cover and cover portions 200, 300 can be affixed to one another in various ways. In this embodiment, the cover portion 200 is welded to the base portion 300 along a seam therebetween. In particular, in this embodiment, the cover and base portions 200, 300 are laser welded to one another. In other embodiments, the cover and base portions 200, 300 may be removably connected to one another.

The internal fluid conduit 15 may comprise a portion that is formed in the cover portion 200 and another portion which is formed in the base portion 300. Attaching the cover portion 200 and the base 300 together brings together the portions of the internal fluid conduit 15 to form the complete internal fluid conduit 15.

Other configurations of the water block 10 are contemplated. For instance, the water block 10 may be a single piece (i.e. the body 100 is a mono-block). In such a case, the body 100 may be made by additive manufacturing, such as 3D printing. Alternatively, the water block 10 may include additional parts affixed to one another to form the body 100.

In this embodiment, the cover and base portions 200, 300 are made of a thermally conductive material such as metal, for instance copper or aluminum. However, it is contemplated that the cover and base portions 200, 300 could be made from different thermally conductive materials in other embodiments, including combining different materials (e.g., cover portion 200 made from a different material than the base portion 300).

Figure 17:
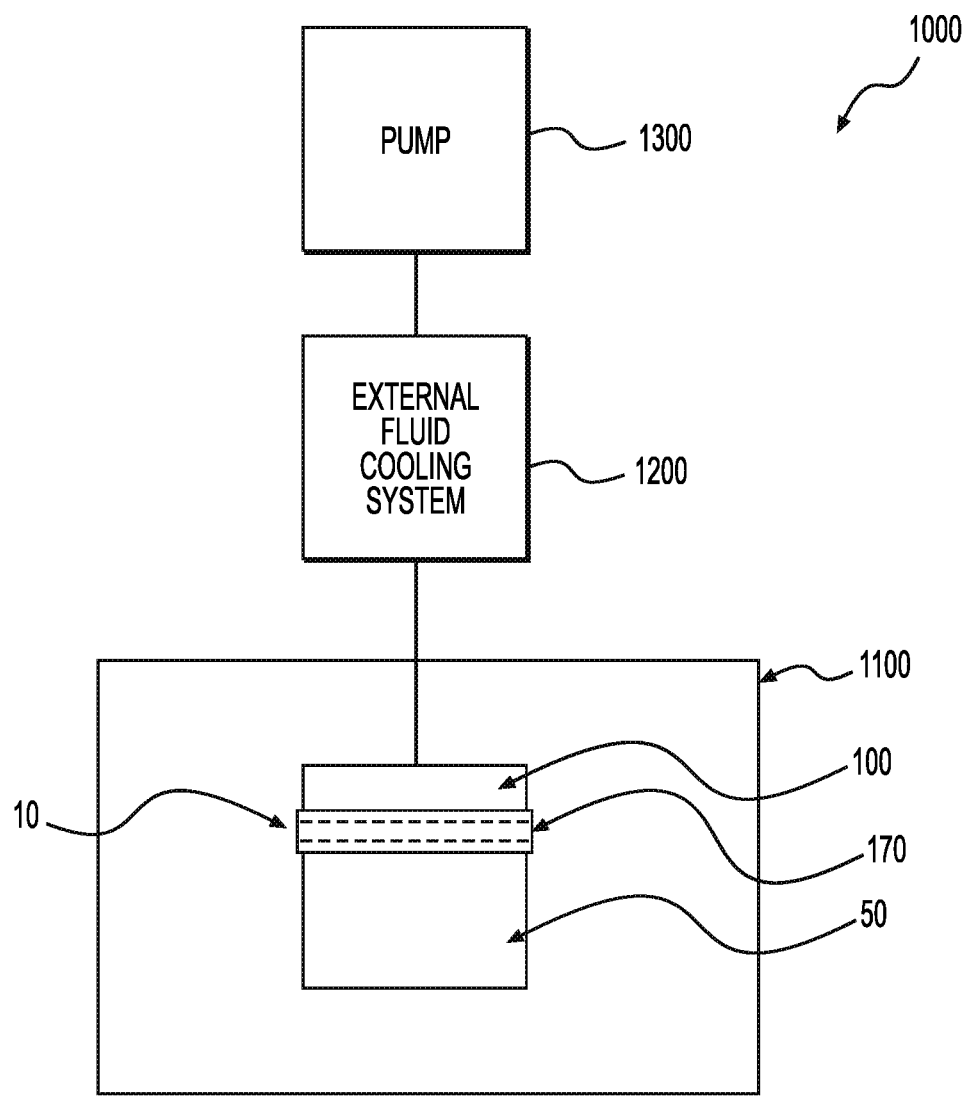
FIG. 17 is a schematic illustration of an immersion cooling system including the water block of FIG. 1.

As will be appreciated, the water block 10 can be useful in various applications, including for example in an immersion cooling heat transfer system. That is, the water block 10 can be used as part of a cooling system implementing immersion cooling whereby the electronic component 50 is immersed in immersion cooling liquid. Referring to FIG. 17, there is shown an example immersion cooling system 1000 comprising an immersion case 1100 configured to house immersion cooling liquid and to submerge the electronic component 50 and the water block 10 housed thereon. The immersion case 1100 may be any container (e.g., a casing) suitable for use in immersion cooling of the electronic component 50. It is to be understood that the electronic component 50 may be connected to a substrate component (e.g., a printed circuit board (PCB)) in which case the substrate component is placed in the immersion case 1100 together with the heat-generating component 50.

The water block 10 is installed on the electronic component 50 such that the first surface 110 is thermally connected to a surface of the electronic component 50. Next, the heat transfer fluid is pumped through the internal fluid conduit 15. The water block 10 may be fluidly connected to an external fluid cooling system 1200 that delivers cooled liquid to the water block 10 and receives heated water from the water block 10. For example, the external fluid cooling system 1200 may include a dry cooler for cooling the heated water and a pump 1300 for pumping the water through the external cooling circuit.

The immersion case 1100 is then filled with the immersion cooling liquid which may be different from the heat transfer fluid, given that the immersion cooling liquid is a dielectric fluid. In certain embodiments, the immersion cooling liquid and the dielectric fluid may be the same fluid. The electronic component 50 and the water block 10 including the gasket 170 are thus immersed in the immersion cooling liquid. In some embodiments, a pumping system (not shown) is connected to the immersion case 1100 to pump the immersion cooling liquid through the immersion case (forced convection). In alternative embodiments, the pumping system may be omitted.

A method for cooling the electronic component comprises placing the water block 10 on the electronic component 50 such that the gasket 170 fluidly seals the first surface 110 of the water block 10 and thermal paste 140 is encircled by the gasket 170; and immersing the water block 10 and the electronic component 50 in immersion cooling liquid.

It is to be understood that many of the features described with respect to different embodiments of the water block 10 may be combined where they do not contradict one another.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

It is to be understood that terms relating to the position and/or orientation of components such as "upper", "lower", "top", "bottom", "front", "rear", "left", "right", are used herein to simplify the description and are not intended to be limitative of the particular position/orientation of the components in use.

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future.

Modifications and improvements to the above-described implementations of the present technology may become apparent to those skilled in the art. The foregoing description is intended to be exemplary rather than limiting. The scope of the present technology is therefore not intended to be limited by specificities of the shown examples.

The invention claimed is:

1. A liquid cooling device mountable on a heat-generating electronic component, comprising:
    a body incorporating an internal fluid conduit for internally circulating a heat-transfer fluid to flow therethrough, the body comprising:
        a cover portion on an upper side of the body having a second surface atop the cover portion;
        a base portion disposed between the cover portion and the electronic component;
        a bottom surface of the cover portion incorporating a first section and a top surface of the base portion incorporating a second section arranged to complementary mate with the first section to form the internal fluid conduit upon affixing the cover portion to the base portion;
        a first surface on a lower side of the body arranged to be mounted atop of the electronic component to facilitate thermal transfer from the electronic component to the first surface, the first surface arranged to be in parallel with the second surface;
        at least one side wall extending between the first surface and the second surface of the body;
        a channel formed on an underside of the first surface, the channel configured as a continuous recess extending along a perimeter of the at least one side wall; and
        a gasket fitted within the channel and extending along the perimeter of the at least one side wall, the gasket configured to extend away from the body beyond the first surface in a direction transverse thereto,
    wherein the gasket is arranged to encase and fluidly insulate the first surface from an immersion cooling liquid when the first surface is mounted on the electronic component and submerged in the immersion cooling liquid during operations.

2. The cooling device of claim 1, wherein the channel formed on the underside of the first surface is sized and shaped to sealably house the gasket.

3. The cooling device of claim 2, wherein the channel has a width which is larger than a depth of the channel.

4. The cooling device of claim 2, wherein the channel is defined by a channel wall having at least one linear or curved channel wall portion.

5. The cooling device of claim 2, wherein the first surface has a first surface area which is smaller than a second surface area of the second surface.

6. The cooling device of claim 1, wherein the gasket is made of an elastomeric material.

7. The cooling device of claim 1, wherein the gasket is made of an epoxy resin.

8. The cooling device of claim 7, wherein the gasket is made by applying the epoxy resin to the first surface before polymerization.

9. The cooling device of claim 1, wherein the gasket is of one piece construction.

10. The cooling device of claim 1, wherein one or both of the gasket and the body of the cooling device is made of a material resilient to the immersion cooling liquid.

11. The cooling device of claim 1, further comprising a thermal paste disposed on the first surface to directly contact the electronic component, the gasket further configured to encase and fluidly insulate the thermal paste when the first surface is mounted on the electronic component.

12. The cooling device of claim 11, wherein the thermal paste does not contain indium.

13. The cooling device of claim 1, wherein the body has a body perimeter shape selected from a rectangle, a square and a circle.

14. The cooling device of claim 1, wherein the heat-transfer fluid flowing in the internal fluid conduit is water.

15. The cooling device of claim 1, wherein a cold inlet and a hot outlet extend through the body at the first surface or the second surface.

16. A method for cooling an electronic component, comprising:
   placing the liquid cooling device of claim 1 on the heat-generating electronic component such that the gasket fluidly seals the first surface of the liquid cooling device; and
   immersing the liquid cooling device and the heat-generating electronic component in the immersion cooling liquid.

17. The method of claim 16, further comprising pumping the heat-transfer fluid through the internal fluid conduit defined by the cooling device, wherein the immersion cooling liquid is different than the heat-transfer fluid.

18. A cooling system comprising:
   at least one liquid cooling device comprising:
      a body incorporating an internal fluid conduit for internally circulating a heat-transfer fluid to flow therethrough, the body comprising:
      a cover portion on an upper side of the body having a second surface atop the cover portion;
      a base portion disposed between the cover portion and an electronic component;
      a bottom surface of the cover portion incorporating a first section and a top surface of the base portion incorporating a second section arranged to complementary mate with the first section to form the internal fluid conduit upon affixing the cover portion to the base portion;
      a first surface on a lower side of the body arranged to be mounted atop of the electronic component to facilitate thermal transfer from the electronic component to the first surface, the first surface arranged to be in parallel with the second surface;
      at least one side wall extending between the first surface and the second surface of the body;
      a channel formed on an underside of the first surface, the channel configured as a continuous recess extending along a perimeter of the at least one side wall; and
      a gasket fitted within the channel and extending along the perimeter of the at least one side wall, the gasket configured to extend away from the body beyond the first surface in a direction transverse thereto, the gasket arranged to encase and fluidly insulate the first surface from an immersion cooling liquid when the first surface is mounted on the electronic component and submerged in the immersion cooling liquid during operations; and
   an immersion case configured to immerse the electronic component and the at least one liquid cooling device housed therein in the immersion cooling liquid.

19. The cooling system of claim 18, further comprising:
   an external fluid cooling unit configured to receive a flow of the heat-transfer fluid from the at least one liquid cooling device, the external fluid cooling unit being adapted to dissipate heat from the heat-transfer fluid; and
   a pump adapted to maintain the flow of the heat-transfer fluid circulating in a cooling circuit, allowing to transfer thermal energy from the at least one liquid cooling device to the heat-transfer fluid and to transfer thermal energy from the heat-transfer fluid to the external fluid cooling unit.

* * * * *